United States Patent
Lee

(10) Patent No.: US 11,749,635 B2
(45) Date of Patent: Sep. 5, 2023

(54) SEMICONDUCTOR DEVICE AND MANUFACTURING METHOD OF SEMICONDUCTOR DEVICE

(71) Applicant: SK hynix Inc., Icheon-si (KR)

(72) Inventor: Nam Jae Lee, Icheon-si (KR)

(73) Assignee: SK hynix Inc., Icheon-si (KR)

( * ) Notice: Subject to any disclaimer, the term of this patent is extended or adjusted under 35 U.S.C. 154(b) by 233 days.

(21) Appl. No.: 17/242,536

(22) Filed: Apr. 28, 2021

(65) Prior Publication Data
US 2022/0130791 A1 Apr. 28, 2022

(30) Foreign Application Priority Data
Oct. 23, 2020 (KR) .................. 10-2020-0138389

(51) Int. Cl.
H01L 23/00 (2006.01)
H01L 25/18 (2023.01)
H01L 25/00 (2006.01)
H01L 25/065 (2023.01)

(52) U.S. Cl.
CPC .............. *H01L 24/45* (2013.01); *H01L 24/03* (2013.01); *H01L 24/05* (2013.01); *H01L 24/08* (2013.01); *H01L 24/80* (2013.01); *H01L 25/0657* (2013.01); *H01L 25/18* (2013.01); *H01L 25/50* (2013.01); *H01L 2224/03614* (2013.01); *H01L 2224/04042* (2013.01); *H01L 2224/05017* (2013.01); *H01L 2224/08145* (2013.01); *H01L 2224/4502* (2013.01); *H01L 2224/45124* (2013.01); *H01L 2224/45147* (2013.01); *H01L 2224/80895* (2013.01); *H01L 2224/80896* (2013.01); *H01L 2924/1431* (2013.01); *H01L 2924/1444* (2013.01); *H01L 2924/14511* (2013.01)

(58) Field of Classification Search
CPC combination set(s) only.
See application file for complete search history.

(56) References Cited

U.S. PATENT DOCUMENTS

| 8,110,931 | B2 | 2/2012 | Chang et al. | |
|---|---|---|---|---|
| 2003/0230809 | A1* | 12/2003 | Nakajima | ............... H01L 24/03 257/E23.145 |
| 2009/0008783 | A1* | 1/2009 | Saigoh | .................. H01L 23/564 257/760 |
| 2018/0286911 | A1 | 10/2018 | Kagawa et al. | |

FOREIGN PATENT DOCUMENTS

KR   102070089 B1   1/2020

* cited by examiner

Primary Examiner — Niki H Nguyen
(74) Attorney, Agent, or Firm — WILLIAM PARK & ASSOCIATES LTD.

(57) ABSTRACT

A semiconductor device includes a first insulating layer, wire contacts spaced apart from each other by the first insulating layer, and a bonding wire connected to the wire contacts. Each of the wire contacts includes a base part in the first insulating layer and a protrusion part protruding from inside to outside the first insulating layer. The protrusion parts of the wire contacts are in contact with the bonding wire.

26 Claims, 14 Drawing Sheets

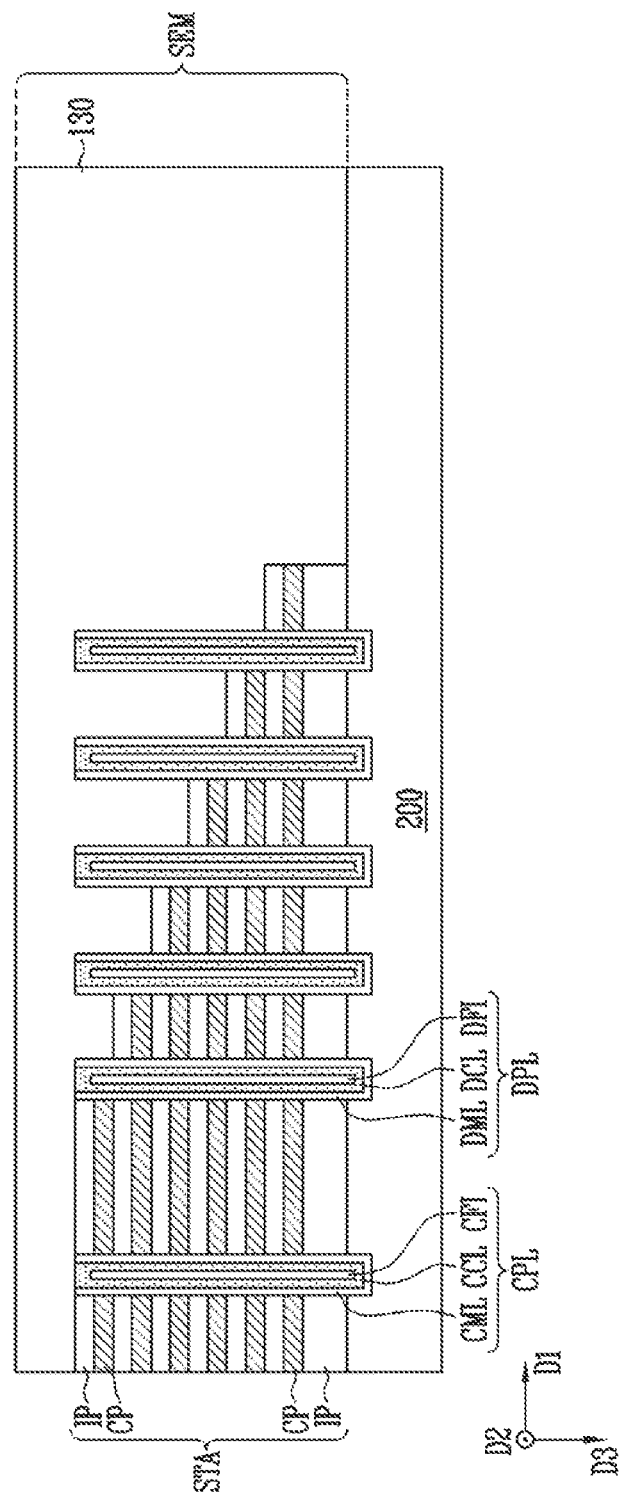

US 11,749,635 B2

SEMICONDUCTOR DEVICE AND MANUFACTURING METHOD OF SEMICONDUCTOR DEVICE

CROSS-REFERENCE TO RELATED APPLICATION

The present application claims priority under 35 U.S.C. § 119(a) to Korean patent application number 10-2020-0138389 filed on Oct. 23, 2020, in the Korean Intellectual Property Office, the entire disclosure of which is incorporated by reference herein.

BACKGROUND

Technical Field

The present disclosure generally relates to a semiconductor device and a manufacturing method of a semiconductor device, and more particularly, to a three-dimensional semiconductor device and a manufacturing method of a three-dimensional semiconductor device.

Related Art

A semiconductor device includes memory cells capable of storing data. A three-dimensional semiconductor device includes memory cells arranged in three dimensions so that an area occupied by memory cells on a substrate can be reduced.

In order to improve the degree of integration of the three-dimensional semiconductor device, a number of stacking levels for the memory cells of the three-dimensional semiconductor device may be increased. The operational reliability of the three-dimensional semiconductor device, however, may deteriorate as the number of stacking levels increase.

SUMMARY

In an embodiment of the present disclosure, a semiconductor device includes a first insulating layer, wire contacts spaced apart from each other by the first insulating layer, and a bonding wire connected to the wire contacts. Each of the wire contacts includes a base part in the first insulating layer and a protrusion part protruding from inside to outside the first insulating layer. The protrusion parts of the wire contacts are in contact with the bonding wire.

In an embodiment of the present disclosure, a semiconductor device includes a first insulating layer including a recess, wire contacts exposed by the recess of the first insulating layer, a bonding wire connected to the wire contacts, and a second insulating layer filling the recess. The bonding wire includes at least one interposition part interposed between the wire contacts. A lower surface of the at least one interposition part is in contact with at least one of the first insulating layer and the second insulating layer.

In an embodiment of the present disclosure, a semiconductor device includes: a semiconductor structure including a stack structure and an insulating layer surrounding the stack structure; a peripheral circuit structure including a peripheral transistor; a connection structure disposed between the semiconductor structure and the peripheral circuit structure, the connection structure including a wire connection conductor; wire contacts penetrating the insulating layer, the wire contacts being electrically connected to the wire connection conductor; and a bonding wire connected to the wire contacts.

In an embodiment of the present disclosure, a method of manufacturing a semiconductor device includes forming a stack structure including alternately stacked conductive patterns and insulating patterns, forming an insulating layer surrounding the stack structure, forming wire contacts penetrating the insulating layer, etching the insulating layer to expose the wire contacts, and forming a bonding wire connected to the wire contacts.

BRIEF DESCRIPTION OF THE DRAWINGS

Example embodiments are described hereinafter with reference to the accompanying drawings; however, they may be embodied in different forms and should not be construed as being limited to the embodiments set forth herein.

In the drawing figures, dimensions may be exaggerated for clarity of illustration. It will be understood that when an element is referred to as being "between" two elements, it can be the only element between the two elements, or one or more intervening elements may also be present. Like reference numerals refer to like elements throughout.

FIGS. 2, 3, 4, 5, 6, 7, 8, and 9 are views illustrating a manufacturing method of a semiconductor device in accordance with an embodiment of the present disclosure.

DETAILED DESCRIPTION

Specific structural or functional descriptions disclosed herein are merely illustrative for the purpose of describing embodiments according to the concept of the present disclosure. Embodiments according to the concept of the present disclosure can be implemented in various forms and should not be construed as being limited to the specific embodiments set forth herein.

Hereinafter, the terms 'first' and 'second' are used to distinguish one component from another component rather than describing a number or order of components. The terms may be used to describe various components, but the components are not limited by the terms.

Some embodiments are directed to a semiconductor device in which a degree of integration is enhanced and operational reliability is improved.

Figure 1A:
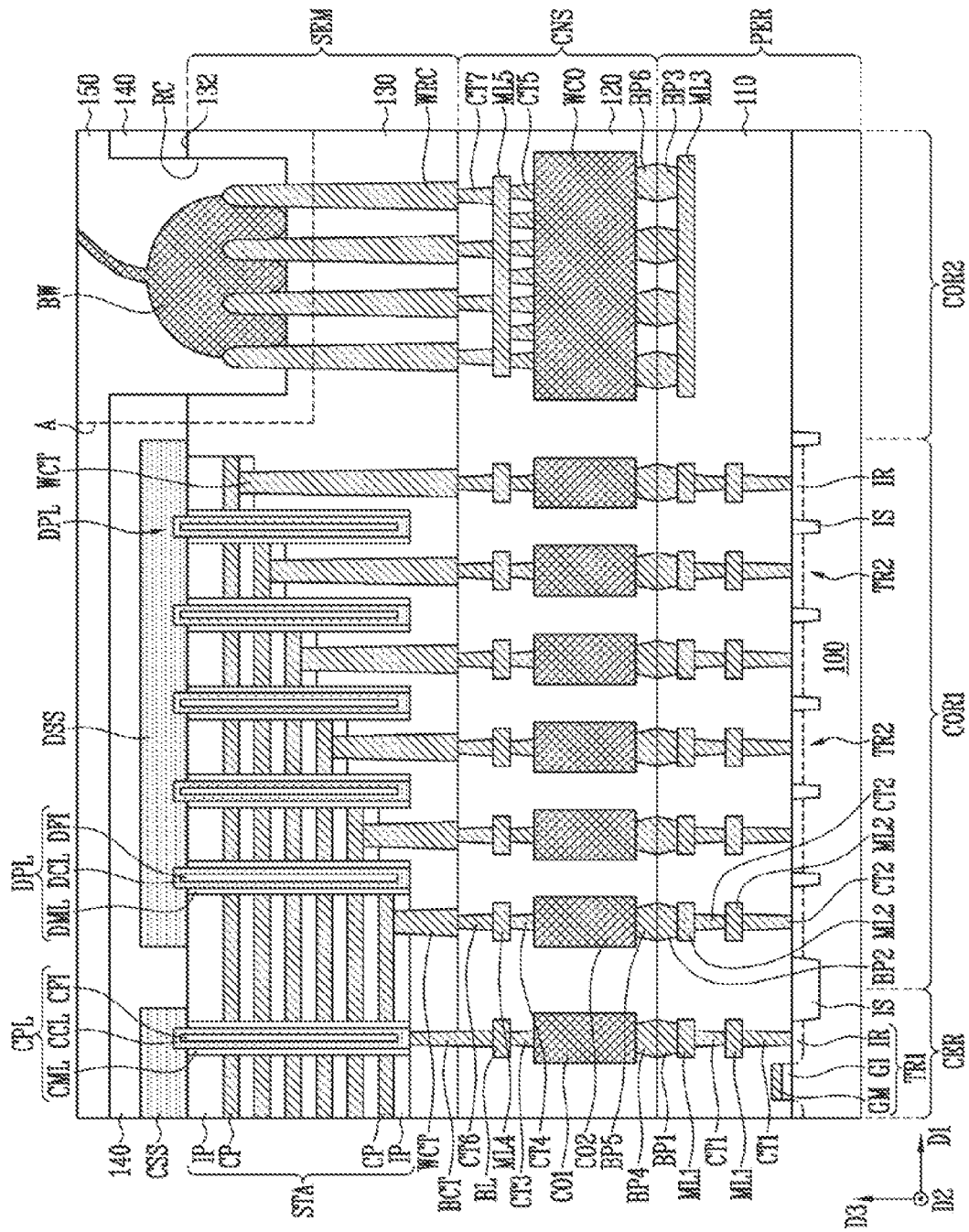
FIG. 1A is a sectional view of a semiconductor device in accordance with an embodiment of the present disclosure.

FIG. 1A is a sectional view of a semiconductor device in accordance with an embodiment of the present disclosure. FIG. 16 is an enlarged view of region A shown in FIG. 1A. FIG. 1C is a plan view illustrating wire contacts and a bonding wire in accordance with an embodiment of the present disclosure.

Referring to FIG. 1A, the semiconductor device may include a cell region CER, a first connection region COR1, and a second connection region COR2. The cell region CER, the first connection region COR1, and the second connection region COR2 may be divided from each other, in a plane extending in a first direction D1 and a second direction D2. An active region and an isolation region may be divided from each other, in a plane extending in a first direction D1 and a second direction D2. The cell region CER may be surrounded by the first connection region COR1. The first direction D1 and the second direction D2 may intersect each other in that the directions D1 and D2 are not parallel. In an embodiment, the first direction D1 and the second direction D2 may be orthogonal to each other.

The semiconductor device may include a peripheral circuit structure PER. The peripheral circuit structure PER may include a first substrate 100, a first peripheral transistor TR1, second peripheral transistors TR2, isolation layers IS, a first insulating layer 110, first contacts CT1, first lines ML1, first bonding pads BP1, second contacts CT2, second lines ML2, second bonding pads BP2, a third line ML3, and third bonding pads BP3.

The first substrate 100 may have the shape of a plate extending in the first direction D1 and the second direction D2. In an embodiment, the first substrate 100 may be a semiconductor substrate.

The first insulating layer 110 may cover the first substrate 100. The first insulating layer 110 may include an insulating material. In an embodiment, the first insulating layer 110 may include oxide or nitride.

The first peripheral transistor TR1 and the second peripheral transistors TR2 may be located between the first insulating layer 110 and the first substrate 100. The first peripheral transistor TR1 may be located in the cell region CER. The second peripheral transistors TR2 may be located in the first connection region COR1. The first and second peripheral transistors TR1 and TR2 may constitute a peripheral circuit of the semiconductor device or be transistors connected to the peripheral circuit of the semiconductor device. In an embodiment, the first peripheral transistor TR1 may constitute a page buffer of the semiconductor device or be a transistor connected to the page buffer of the semiconductor device. In an embodiment, the second peripheral transistors TR2 may constitute an X-decoder of the semiconductor device or be transistors connected to the X-decoder of the semiconductor device.

Each of the first and second peripheral transistors TR1 and TR2 may include impurity regions IR, a gate insulating layer GI, and a gate electrode GM. The impurity regions IR may be formed by doping an impurity into the first substrate 100. The gate electrode GM may be spaced apart from the first substrate 100 by the gate insulating layer GI. The gate insulating layer GI may include an insulating material. In an embodiment, the gate insulating layer GI may include oxide. The gate electrode GM may include a conductive material. In an embodiment, the gate electrode GM may include tungsten.

The gate electrode GM and the gate insulating layer GI of the first peripheral transistor TR1 may extend in the second direction D2. The gate electrode (not shown) and the gate insulating layer (not shown) of the second peripheral transistor TR2 may extend in the first direction D1. The second peripheral transistors TR2 may share the gate electrode and the gate insulating layer.

The isolation layers IS may be located in the first substrate 100. The isolation layers IS may electrically isolate the impurity regions IR of the first and second peripheral transistors TR1 and TR2 from each other. The isolation layers IS may include an insulating material. In an embodiment, the isolation layers IS may include oxide.

The first contacts CT1 and the first lines ML1 may be connected to the first peripheral transistor TR1. The first contacts CT1 and the first lines ML1 may be connected to each other. The first contacts CT1 and the first lines ML1 may be located in the first insulating layer 110. The first contacts CT1 and the first lines MLA may be located in the cell region CER. The first contacts CT1 and the first lines ML1 may include a conductive material. In an embodiment, the first contacts CT1 and the first lines ML1 may include tungsten.

The first bonding pad BP1 may be connected to the first line ML1. The first bonding pad BP1 may be located in the first insulating layer 110. The first bonding pad BP1 may be located in the cell region CER. A width of the first bonding pad BP1 may become smaller coming closer to the first substrate 100. In an embodiment, a width of the first bonding pad BP1 in the first direction D1 may become smaller coming closer to the first substrate 100. The first bonding pad BP1 may include a conductive material. In an embodiment, the first bonding pad BP1 may include copper.

The second contacts CT2 and the second lines ML2 may be connected to the second peripheral transistor TR2. The second contacts CT2 and the second lines ML2 may be connected to each other. The second contacts CT2 and the second lines ML2 may be located in the first insulating layer 110. The second contacts CT2 and the second lines ML2 may be located in the first connection region COR1. The second contacts CT2 and the second lines ML2 may include a conductive material. In an embodiment, the second contacts CT2 and the second lines ML2 may include tungsten.

The second bonding pads BP2 may be disposed at the same level as the first bonding pad BP1. The second bonding pad BP2 may be connected to the second line ML2. The second bonding pads BP2 may be located in the first insulating layer 110. The second bonding pads BP2 may be located in the first connection region COR1. A width of the second bonding pad BP2 may become smaller coming closer to the first substrate 100. In an embodiment, a width of the second bonding pad BP2 in the first direction D1 may become smaller coming closer to the first substrate 100. The second bonding pad BP2 may include a conductive material. In an embodiment, the second bonding pad BP2 may include copper.

The third line ML3 may be located in the first insulating layer 110. The third line ML3 may be disposed at the same level as some lines disposed at the highest level among the first and second lines MU and ML2. The third line ML3 may be located in the second connection region COR2. The third line ML3 may include a conductive material. In an embodiment, the third line ML3 may include tungsten.

The third bonding pads BP3 may be disposed at the same level as the first and second bonding pads BP1 and BP2. A plurality of third bonding pads BP3 may be connected to the third line ML3. The third bonding pads BP3 may be located in the first insulating layer 110. The third bonding pads BP3 may be located in the second connection region COR2. A width of the third bonding pad BP3 may become smaller coming closer to the first substrate 100. In an embodiment, a width of the third bonding pad BP3 in the first direction D1 may become smaller coming closer to the first substrate 100. The third bonding pad BP3 may include a conductive material. In an embodiment, the third bonding pad BP3 may include copper.

A connection structure CNS may be located on the peripheral circuit structure PER. The connection structure CNS may include a second insulating layer 120, a fourth bonding pad BP4, fifth bonding pads BP5, sixth bonding pads BP6, a first connection conductor CO1, second connection conductors CO2, a wire connection conductor WCO, a third contact CT3, fourth contacts CT4, fifth contacts CT5, a bit line BL, fourth lines ML4, a fifth line ML5, sixth contacts CT6, and seventh contacts CT7.

The second insulating layer 120 may cover the first insulating layer 110. The second insulating layer 120 may include an insulating material. In an embodiment, the second insulating layer 120 may include oxide or nitride.

The fourth bonding pad BP4 may be connected to the first bonding pad BP1. The fourth bonding pad BP4 may be in contact with the first bonding pad BP1. The fourth bonding pad BP4 may be located in the second insulating layer 120. The fourth bonding pad BP4 may be located in the cell region CER. A width of the fourth bonding pad BP4 may become larger coming closer to the first bonding pad BP1. In an embodiment, a width of the fourth bonding pad BP4 in the first direction D1 may become larger coming closer to the first bonding pad BP1. The width of the first bonding pad BP1 may become larger coming closer to the fourth bonding pad BP4. The fourth bonding pad BP4 may include a conductive material. In an embodiment, the fourth bonding pad BP4 may include copper.

The fifth bonding pads BP5 may be disposed at the same level as the fourth bonding pad BP4. The fifth bonding pad BP5 may be connected to the second bonding pad BP2. The fifth bonding pad BP5 may be in contact with the second bonding pad BP2. The fifth bonding pads BP5 may be located in the second insulating layer 120. The fifth bonding pads BP5 may be located in the first connection region COR1. A width of the fifth bonding pad BP5 may become larger coming closer to the second bonding pad BP2. In an embodimlent, a width of the fifth bonding pad BP5 in the first direction D1 may become larger coming closer to the second bonding pad BP2. The width of the second bonding pad BP2 may become larger coming closer to the fifth bonding pad BP5. The fifth bonding pad BP5 may include a conductive material. In an embodiment, the fifth bonding pad BP5 may include copper.

The sixth bonding pads BP6 may be disposed at the same level as the fourth and fifth bonding pads BP4 and BP5. The sixth bonding pad BP6 may be connected to the third bonding pad BP3. The sixth bonding pad BP6 may be in contact with the third bonding pad BP3. The sixth bonding pads BP6 may be located in the second insulating layer 120. The sixth bonding pads BP6 may be located in the second connection region COR2. A width of the sixth bonding pad BP6 may become larger coming closer to the third bonding pad BP3. In an embodiment, a width of the sixth bonding pad BP6 in the first direction D1 may become larger coming closer to the third bonding pad BP3. The width of the third bonding pad BP3 may become larger coming closer to the sixth bonding pad BP6. The sixth bonding pad BP6 may include a conductive material. In an embodiment, the sixth bonding pad BP6 may include copper.

The first connection conductor CO1 may be connected to the fourth bonding pad BP4. The first connection conductor CO1 may be located in the second insulating layer 120. The first connection conductor CO1 may be located in the cell region CER.

The second connection conductor CO2 may be connected to the fifth bonding pad BP5. The second connection conductors CO2 may be disposed at the same level as the first connection conductor CO1. The second connection conductors CO2 may be located in the second insulating layer 120. The second connection conductors CO2 may be located in the first connection region COR1.

The wire connection conductor WCO may be connected to the sixth bonding pads BP6. The wire connection conductor WCO may be disposed at the same level as the first and second connection conductors CO1 and CO2. The wire connection conductor WCO may be located in the second insulating layer 120. The wire connection conductor WCO may be located in the second connection region CO2.

The third contact CT3 may be connected to the first connection conductor CO1. The third contact CT3 may be located in the second insulating layer 120. The third contact CT3 may be located in the cell region CER. The third contact CT3 may include a conductive material. In an embodiment, the third contact CT3 may include tungsten.

The fourth contact CT4 may be connected to the second connection conductor CO2. The fourth contacts CT4 may be located in the second insulating layer 120. The fourth contacts CT4 may be located in the first connection region COR1. The fourth contacts CT4 may be disposed at the same level as the third contact CT3. The fourth contact CT4 may include a conductive material. In an embodiment, the fourth contact CT4 may include tungsten.

A plurality of fifth contacts CT5 may be connected to the wire connection conductor WCO. The fifth contacts CT5 may be located in the second connection region COR2. The fifth contacts CT5 may be disposed at the same level as the third and fourth contacts CT3 and CT4. The fifth contact CT5 may include a conductive material. In an embodiment, the fifth contact CT5 may include tungsten.

The bit line BL may be connected to the third contact CT3. The bit line BL may be located in the second insulating layer 120. The bit line BL may be located in the cell region CER. The bit line BL may extend in the second direction D2. The bit line BL may include a conductive material. The bit line BL may include tungsten.

The fourth line ML4 may be connected to the fourth contact CT4. The fourth lines ML4 may be located in the second insulating layer 120. The fourth lines ML4 may be located in the first connection region COR1. The fourth lines ML4 may be disposed at the same level as the bit line BL. The fourth line ML4 may include conductive material. The fourth line ML4 may include tungsten.

The fifth line ML5 may be connected to the plurality of fifth contacts CT5. The fifth line ML5 may be located in the second insulating layer 120. The fifth line ML5 may be located in the second connection region COR2. The fifth line ML5 may be disposed at the same level as the bit line BL and the fourth lines ML4. The fifth line ML5 may include a conductive material. The fifth line ML5 may include tungsten.

A semiconductor structure SEM may be located on the connection structure CNS. The semiconductor structure SEM may include a third insulating layer 130, a stack structure STA, word line contacts WCT, a cell plug CPL, and dummy plugs DPL. The connection structure CNS may be disposed between the semiconductor structure SEM and the peripheral circuit structure PER.

The third insulating layer 130 may cover the second insulating layer 120. The third insulating layer 130 may include an insulating material. In an embodiment, the third insulating layer 130 may include oxide or nitride.

The stack structure STA may be located on the third insulating layer 130. The stack structure STA may include conductive patterns CP and insulating patterns IP, which are alternately stacked in a third direction D3. The third direction D3 may intersect the first direction D1 and the second direction D2 in that the directions D1, D2, and D3 are not parallel. In an embodiment, the third direction D3 may be orthogonal to the first direction D1 and the second direction D2.

The conductive patterns CP may be used as word lines or select lines of the semiconductor device. The conductive patterns CP may include a conductive material. The insulating patterns IP may include an insulating material. In an embodiment, the insulating patterns IP may include oxide.

The stack structure STA may include a stepped structure. The conductive patterns CP and the insulating patterns IP may be stacked to form the stack structure STA in the first connection region COR1. The third insulating layer 130 may include a stepped surface corresponding to the stepped structure of the stack structure STA.

The cell plug CPL may extend in the third direction D3 to penetrate the stack structure STA. The cell plug CPL may be located in the cell region CER. The cell plug CPL may include a cell filling layer CFI, a cell channel layer CCL surrounding the cell filling layer CFI, and a cell memory layer CML surrounding the cell channel layer CCL.

The cell filling layer CFI may include an insulating material. In an embodiment, the cell filling layer CFI may include oxide. The cell channel layer CCL may include a semiconductor material. In an embodiment, the cell channel layer CCL may include poly-silicon. The cell memory layer CML may include a tunnel insulating layer surrounding the cell channel layer CCL, a data storage layer surrounding the tunnel insulating layer, and a blocking layer surrounding the data storage layer. The tunnel insulating layer may include a material through which charges can tunnel. In an embodiment, the tunnel insulating layer may include oxide. In some embodiments, the data storage layer may include a material in which charges can be trapped. In an embodiment, the data storage layer may include nitride. In other embodiments, the data storage layer may include various materials according to a data storage method. In an embodiment, the data storage layer may include silicon, a phase change material, or nanodots. The blocking layer may include a material capable of blocking the movement of charges. In an embodiment, the blocking layer may include oxide.

The dummy plugs DPL may extend in the third direction D3 to penetrate the stack structure STA. The dummy plugs DPL may penetrate the stepped structure of the stack structure STA. The dummy plugs DPL may be located in the first connection region COR1. The dummy plugs DPL may include a dummy filling layer DFI, a dummy channel layer DCL surrounding the dummy filling layer DFI, and a dummy memory layer DML surrounding the dummy channel layer DCL.

The dummy filling layer DFI may include an insulating material. The dummy filling layer DFI may include the same material as the cell filling layer CFI. In an embodiment, the dummy filling layer DFI may include oxide. The dummy channel layer DCL may include a semiconductor material. The dummy channel layer DCL may include the same material as the cell channel layer CCL. In an embodiment, the dummy channel layer DCL may include poly-silicon. The dummy memory layer DML may include a tunnel insulating layer surrounding the dummy channel layer DCL, a data storage layer surrounding the tunnel insulating layer, and a blocking layer surrounding the data storage layer. The tunnel insulating layer, the data storage layer, and the blocking layer of the dummy memory layer DML may be similar to the tunnel insulating layer, the data storage layer, and the blocking layer of the cell memory layer CML.

Each of the word line contacts WCT may connect the sixth contact CT6 and the conductive pattern CP. The word line contacts WCT may penetrate the third insulating layer 130. The word line contacts WCT may be located in the first connection region COR1. The word line contact WCT may include a conductive material. In an embodiment, the word line contact WCT may include tungsten.

The conductive pattern CP may be electrically connected to the second peripheral transistor TR2 through the word line contact WCT, the sixth contact CT6, the fourth line ML4, the fourth contact CT4, the second connection conductor CO2, the fifth bonding pad BP5, the second bonding pad BP2, the second contact CT2, and the second line ML2. The word line contact WCT, the sixth contact CT6, the fourth line ML4, the fourth contact CT4, the second connection conductor CO2, the fifth bonding pad BP5, the second bonding pad BP2, the second contact CT2, and the second line ML2, through which the conductive pattern CP is electrically connected to the second peripheral transistor TR2, may be defined as first conductors. The conductive pattern CP may be electrically connected to the second peripheral transistor TR2 by the first conductors.

The semiconductor device may include a bit line contact BCT. The bit line contact BCT may connect the bit line BL to the cell channel layer CCL of the cell plug CPL. The bit line contact BCT may penetrate the third insulating layer 130. The bit line contact BCT may be located in the cell region CER. The bit line contact BCT may include a conductive material. In an embodiment, the bit line contact BCT may include tungsten.

The cell channel layer CCL of the cell plug CPL may be electrically connected to the first peripheral transistor TR1 through the bit line contact BCT, the bit line BL, the third contact CT3, the first connection conductor CO1, the fourth bonding pad BP4, the first bonding pad BP1, the first contact CT1, and the first line ML1. The bit line contact BCT, the bit line BL, the third contact CT3, the first connection conductor CO1, the fourth bonding pad BP4, the first bonding pad BP1, the first contact CT1, and the first line ML1, through which the cell channel layer CCL of the cell plug CPL is electrically connected to the first peripheral transistor TR1, may be defined as second conductors. The cell channel layer CCL of the cell plug CPL may be electrically connected to the first peripheral transistor TR1 by the second conductors.

A fourth insulating layer 140 may be located on the semiconductor structure SEM. The fourth insulating layer 140 may cover the third insulating layer 130 and the stack structure STA. The fourth insulating layer 140 may include an insulating material. In an embodiment, the fourth insulating layer 140 may include oxide or nitride.

A cell source structure CSS may be located in the fourth insulating layer 140. The cell source structure CSS may be located on the stack structure STA. The cell source structure CSS may be located in the cell region CER. The cell source structure CSS may be connected to the cell channel layer CCL of the cell plug CPL. The cell source structure CSS may include a conductive material. In an embodiment, the cell source structure CSS may include poly-silicon.

A dummy source structure DSS may be located in the fourth insulating layer 140. The dummy source structure DSS may be located on the stack structure STA. The dummy source structure DSS may be located in the first connection region COR1. The dummy source structure DSS may be connected to the dummy channel layers DCL of the dummy plugs DPL. The dummy source structure DSS may be disposed at the same level as the cell source structure CSS. The dummy source structure DSS may include a conductive material. The dummy source structure DSS may include the same material as the cell source structure CSS. In an embodiment, the dummy source structure DSS may include poly-silicon.

The cell source structure CSS and the dummy source structure DSS may be spaced apart from each other. A portion of the fourth insulating layer 140 may be interposed between the cell source structure CSS and the dummy source structure DSS. The cell source structure CSS and the dummy source structure DSS may be electrically isolated from each other.

A recess RC may be defined by the third insulating layer 130 and the fourth insulating layer 140. The recess RC may be defined by surfaces of the third insulating layer 130 and the fourth insulating layer 140. The recess RC may penetrate the fourth insulating layer 140. Top surface 132 of the third insulating layer 130 may be depressed to define the recess RC. A lowermost portion of the recess RC may be disposed in the third insulating layer 130. The recess RC may include sidewalls defined by a sidewall of the third insulating layer 130 and a sidewall of the fourth insulating layer 140.

The semiconductor device may include wire contacts WRC. The wire contacts WRC may penetrate the third insulating layer 130. The wire contact WRC may be connected to the seventh contact CT7. The wire contacts WRC may be located in the second connection region COR2. The wire contacts WRC may be exposed through the recess RC. The wire contacts WRC may be disposed at the same level as the stack structure STA. The wire contacts WRC may include a conductive material. In an embodiment, the wire contacts WRC may include tungsten. The wire contacts WRC may be spaced apart from each other by the third insulating layer 130. A portion of the third insulating layer 130 may be located between the wire contacts WRC.

A bonding wire BW may be connected to a plurality of wire contacts WRC. The bonding wire BW may be in contact with the plurality of wire contacts WRC. A portion of the bonding wire BW may be located in the recess RC. The bonding wire BW may be electrically connected to the third line ML3 through the wire contacts WRC, the seventh contacts CT7, the fifth line ML5, the fifth contacts CT5, the wire connection conductor WCO, the sixth bonding pads BP6, and the third bonding pads BP3. The bonding wire BW may electrically connect the semiconductor device to an external circuit. The bonding wire BW may include a conductive material. In an embodiment, the bonding wire BW may include at least one of gold, silver, copper, and aluminum.

The first connection conductor CO1, the second connection conductor CO2, and the wire connection conductor WCO may include a material different from that of the first to seventh contacts CT1, CT2, CT3, CT4, CT5, CT6, and CT7, the first to fifth lines ML1, ML2, ML3, ML4, and MG, the bit line BL, the bit line contact BCT, the word line contact WCT, and the wire contact WRC. In an embodiment, the first to seventh contacts CT1, CT2, CT3, CT4, CT5, CT6, and CT7, the first to fifth lines ML1, ML2, ML3, ML4, and ML5, the bit line BL, the bit line contact BCT, the word line contact WCT, and the wire contact WRC may include tungsten, and the first connection conductor CO1, the second connection conductor CO2, and the wire connection conductor WCO may include copper or aluminum. The first connection conductor CO1, the second connection conductor CO2, and the wire connection conductor WCO may include the same material.

The fourth insulating layer 140, the wire contacts WRC, and the bonding wire BW may be covered with fifth insulating layer 150. A portion of the fifth insulating layer 150 may fill the recess RC. The fifth insulating layer 150 may include an insulating material. In an embodiment, the fifth insulating layer 150 may include oxide or nitride.

Figure 1B:
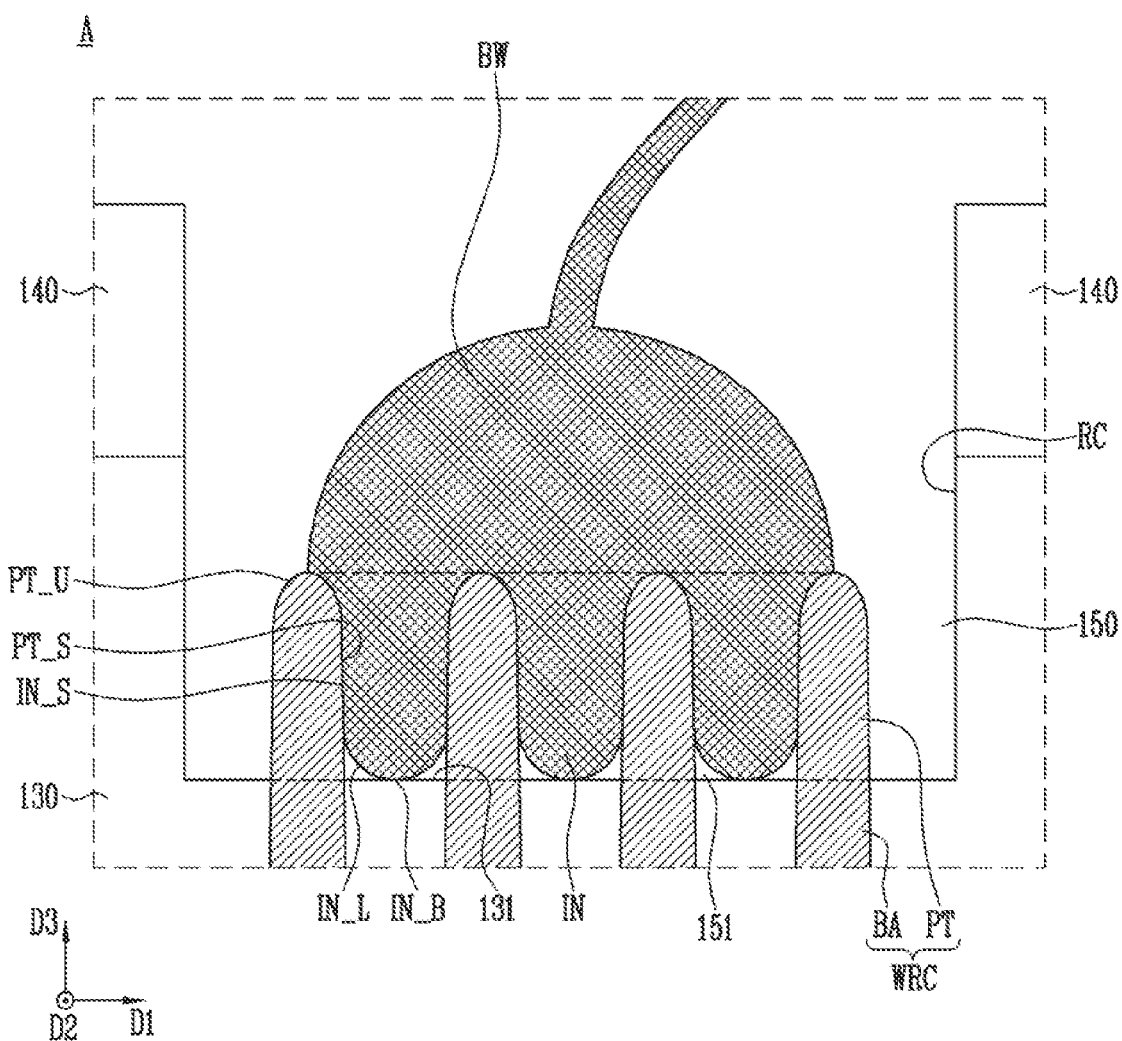
FIG. 1B is an enlarged view of region A shown in FIG. 1A.
Figure 1C:
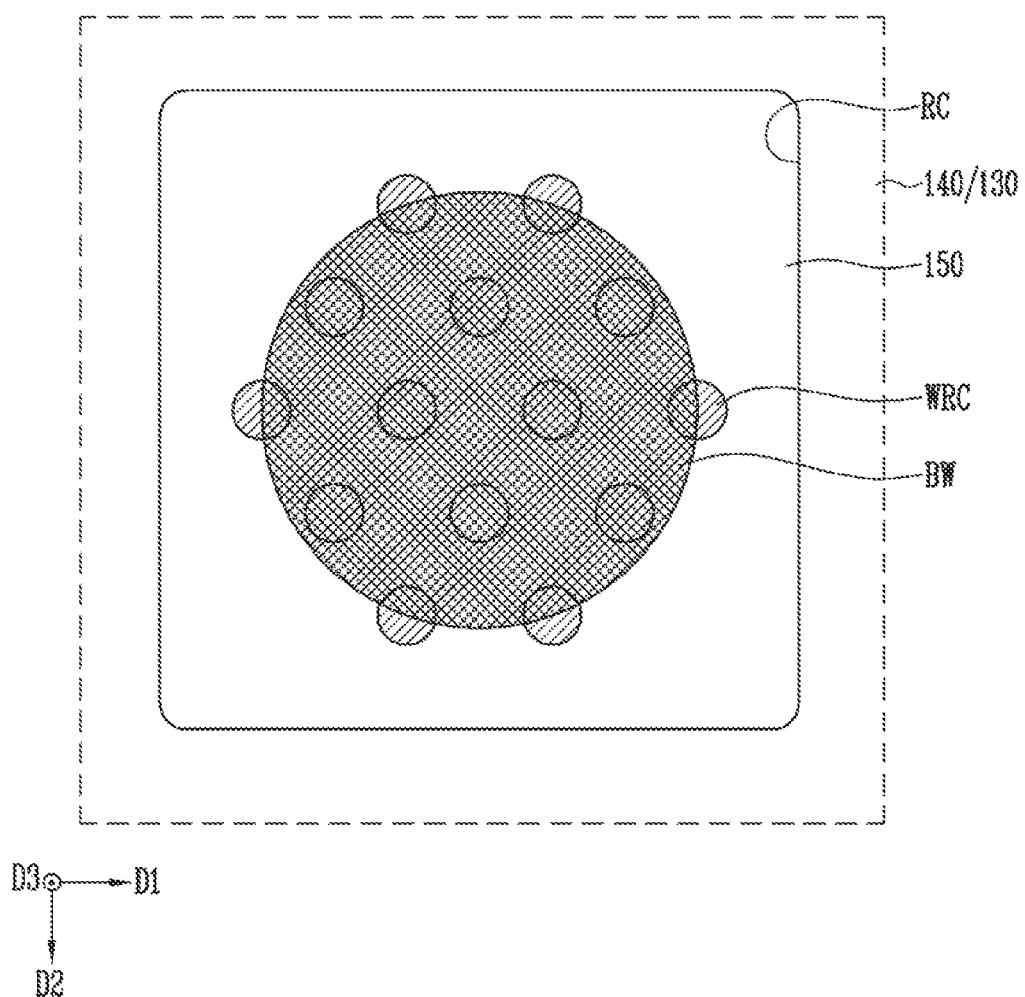
FIG. 1C is a plan view illustrating wire contacts and a bonding wire in accordance with an embodiment of the present disclosure.

Referring to FIGS. 1B and 1C, each of the wire contacts WRC may include a base part BA and a protrusion part PT. The base part BA may be a part surrounded by the third insulating layer 130. The base part BA may be disposed in the third insulating layer 130. The protrusion part PT may be a part protruding to the outside of the third insulating layer 130. The protrusion part PT may be exposed through the recess RC. A top surface PT_U of the protrusion part PT may be curved. In an embodiment, from the viewpoint of a section shown in FIG. 1B, the top surface PT_U of the protrusion part PT may be curved.

The third insulating layer 130 may include a first surface 131 defining a bottom surface of the recess RC. The wire contacts WRC may penetrate the first surface 131. A level of a boundary between the base part BA and the protrusion part PT of the wire contact WRC may be the same as a level of the first surface 131.

The bonding wire WB may include one or more interposition parts IN interposed between the protrusion parts PT of the wire contacts WRC. The interposition parts IN may be connected to each other. The protrusion part PT may be interposed between the interposition parts IN. The interposition part IN may be in contact with the top surface PT_U and a sidewall PT_S of the protrusion part PT. A lower surface IN_L of the interposition part IN may be curved. In an embodiment, from the viewpoint of the section shown in FIG. 1B, the lower surface IN_L of the interposition part IN may be curved. A lowermost portion IN_B of the interposition part IN may be in contact with the first surface 131 of the third insulating layer 130.

A portion of the fifth insulating layer 150 may be interposed between the protrusion parts of the wire contacts WRC. The portion of the fifth insulating layer 150, which is interposed between the protrusion parts PT, may be defined as a first portion 151 of the fifth insulating layer 150. The first portion 151 of the fifth insulating layer 150 may be in contact with the lower surface IN_L of the interposition part IN, the sidewall PT_S of the protrusion part PT, and the first surface 131 of the third insulating layer 130.

In a semiconductor device in accordance with an embodiment of the present disclosure, the bonding wire BW may be located in the recess RC defined by the third insulating layer 130 and the fourth insulating layer 140 and may directly contact the wire contacts WRC without an intermedium such as a top metal pattern. Therefore, the distance at which a signal is transferred between the bonding wire BW and the peripheral transistor may be reduced.

In a semiconductor device in accordance with an embodiment of the present disclosure, the bonding wire BW, the wire contacts WRC, and the wire connection conductor WCO may be disposed adjacent to the stack structure STA and the cell plug CPU, so that the size of the semiconductor device may be reduced.

In a semiconductor device in accordance with an embodiment of the present disclosure, only the wire contacts WRC exposed through the recess RC are connected to the bonding wire BW, so that a phenomenon in which the bonding wire BW contacts another conductor may be prevented. More specifically, conductors other than the wire contacts WRC, such as the first connection conductor CO1, the second connection conductor CO2, the wire connection conductor WCO, the conductive patterns CP, the word line contacts WCT, the cell source structure CSS, etc., may be covered with the second insulating layer 120, the third insulating layer 130, and the fourth insulating layer 140. Thus, it is possible to prevent the bonding wire BW from contacting the conductors other than the wire contacts WRC.

In a semiconductor device in accordance with an embodiment of the present disclosure, a part of each of the wire contacts WRC may be exposed through the recess RC defined by the third insulating layer 130 and the fourth insulating layer 140, and the other part of each of the wire contacts WRC may be protected by the third insulating layer 130. Accordingly, damage of the wire contacts WRC may be reduced.

FIGS. 2, 3, 4, 5, 6, 7, 8, and 9 are views illustrating a manufacturing method of the semiconductor device in accordance with embodiments of the present disclosure. For convenience of description, repeated descriptions of components already described with reference to FIGS. 1A to 1C will be omitted. A manufacturing method of the semiconductor device shown in FIGS. 1A to 1C is not limited to that described below.

Referring to FIG. 2, a second substrate 200 may be formed. The second substrate 200 may have the shape of a plate extending in the first direction D1 and the second direction D2. In an embodiment, the second substrate 200 may be a semiconductor substrate.

A semiconductor structure SEM may be formed on the second substrate 200. A stack structure STA, a cell plug CPL, dummy plugs DPL, and a third insulating layer 130 may be formed on the second substrate 200. The stack structure STA may include conductive patterns CP and insulating patterns IP, which are alternately stacked on the second substrate 200. The third insulating layer 130 may surround the stack structure STA.

Figure 3:
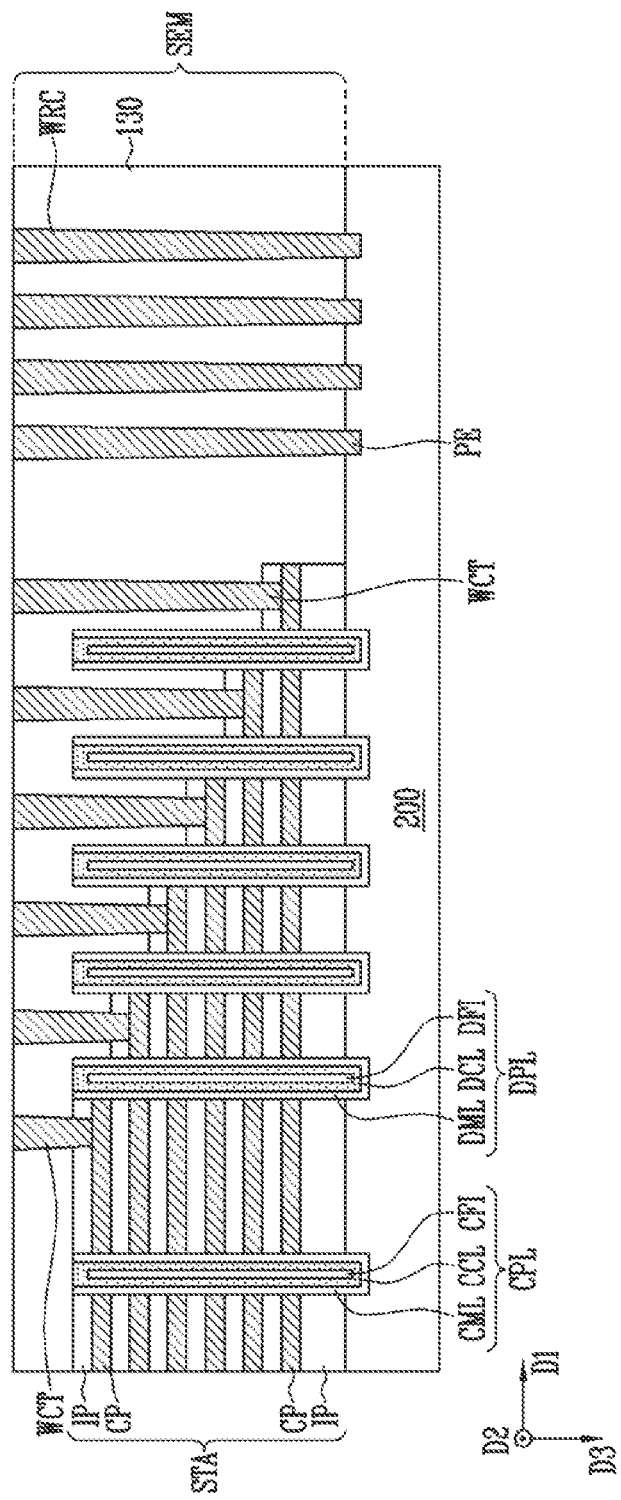

Referring to FIG. 3, word line contacts WCT and wire contacts WRC may be formed to penetrate the third insulating layer 130. The wire contacts WRC may be surrounded by the third insulating layer 130. The wire contact WRC may include a preliminary etching part PE inserted into the second substrate 200. The preliminary etching part PE may be located in the second substrate 200.

Figure 4:
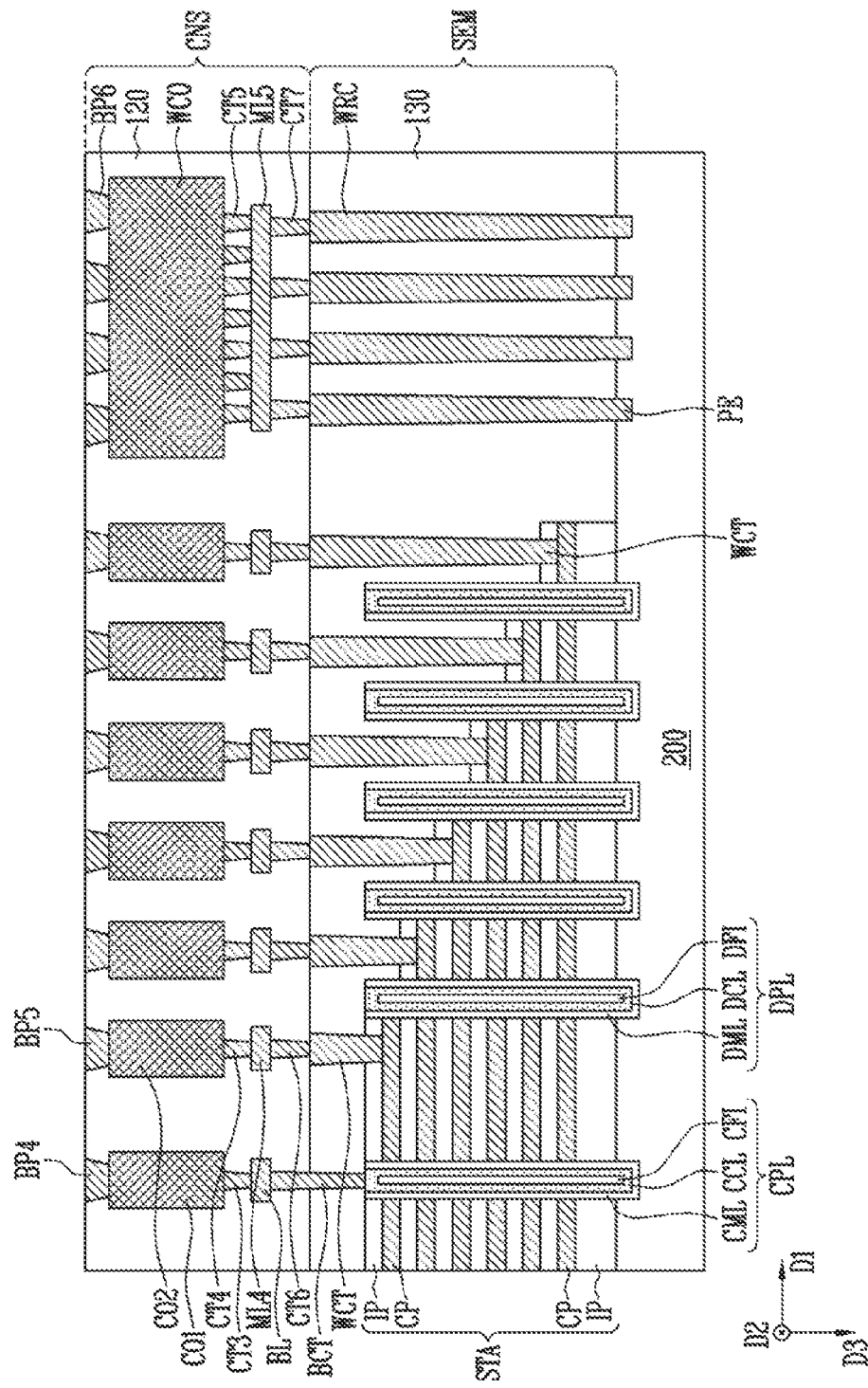

Referring to FIG. 4, a connection structure CNS may be formed on the semiconductor structure SEM. A second insulating layer 120, a bit line contact BCT, sixth contacts CT6, seventh contacts CT7, a bit line BL, fourth lines ML4, a fifth line ML5, third contacts CT3, fourth contacts CT4, fifth contacts CT5, a first connection conductor CO1, second connection conductors CO2, a wire connection conductor WCO, a fourth bonding pad BP4, fifth bonding pads BP5, and sixth bonding pads BP6 may be formed on the third insulating layer 130.

Figure 5:
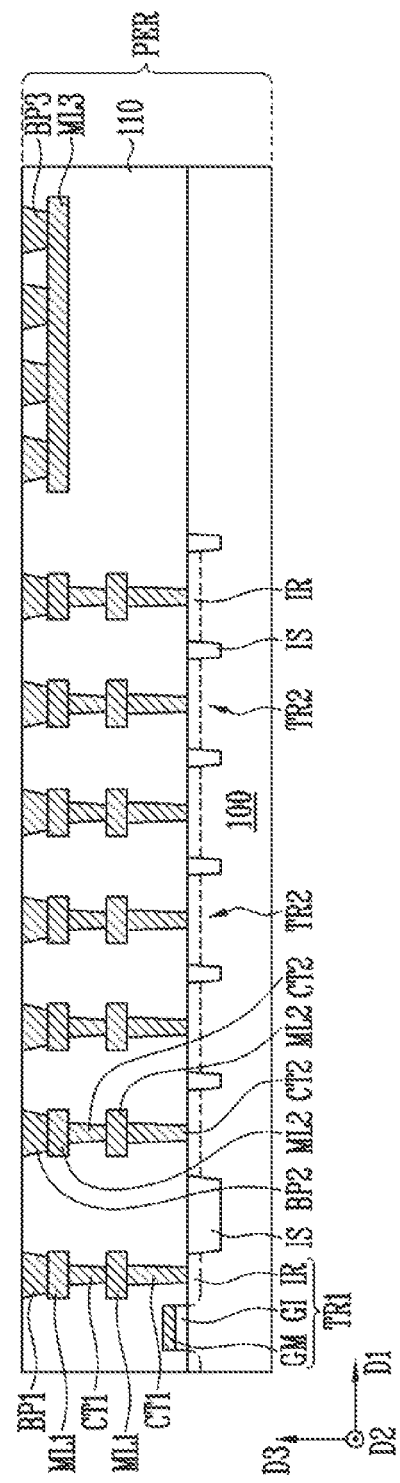

Referring to FIG. 5, a peripheral circuit structure PER may be formed to include a first substrate 100 and first and second peripheral transistors TR1 and TR2. The impurity regions IR of the first and second peripheral transistors TR1 and TR2 may be insulated each other by isolation layers IS, disposed in the first substrate 100. A gate insulating layer GI and a gate electrode GM of each of the first and second peripheral transistors TR1 and TR2 may be stacked on the first substrate 100. The peripheral circuit structure PER may include a first insulating layer 110, first contacts CT1, first lines ML1, second contacts CT2, second lines ML2, a first bonding pad BP1, second bonding pads BP2, a third line ML3, and third bonding pads BP3, which are disposed on the first substrate 100.

Figure 6:
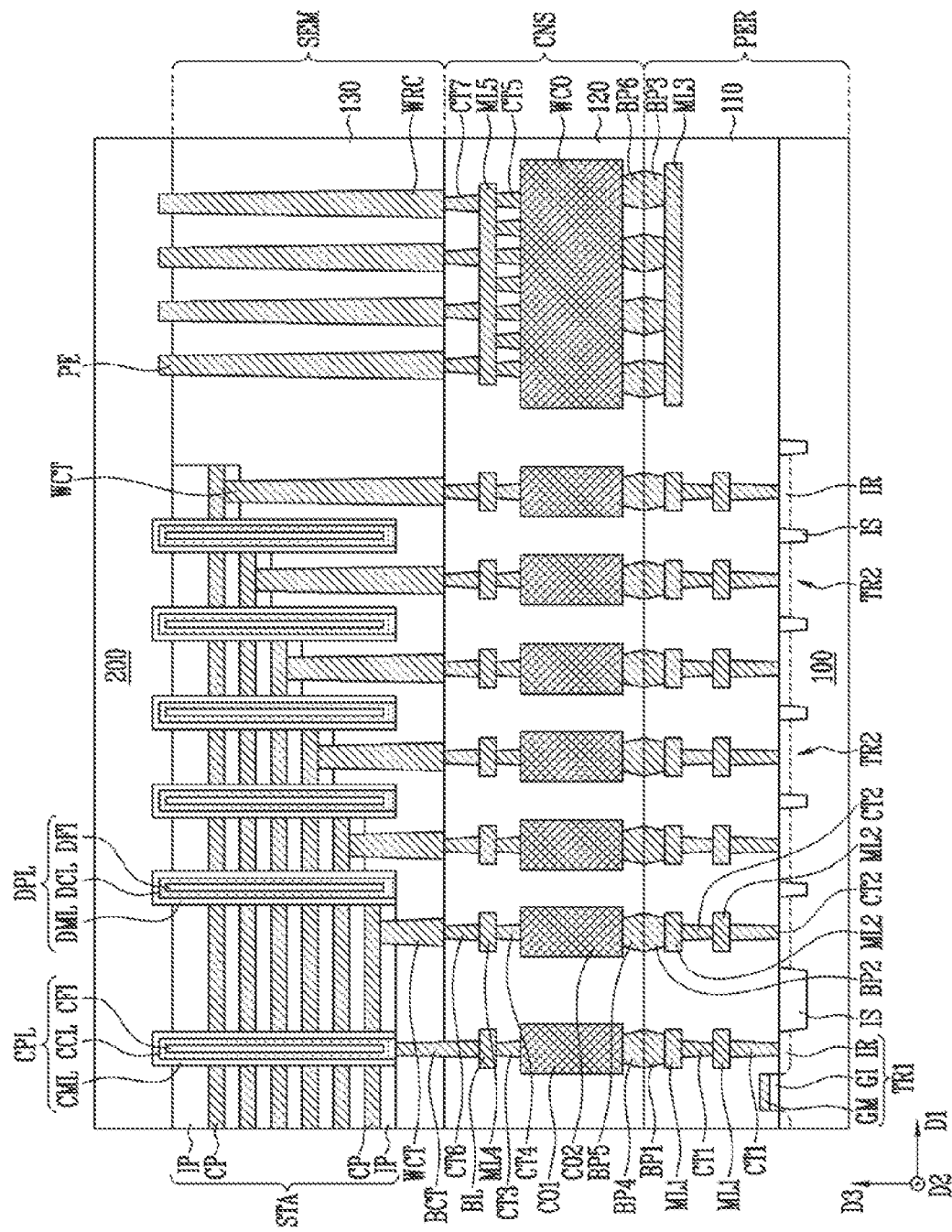

Referring to FIG. 6, the second substrate 200, the semiconductor structure SEM, and the connection structure CNS may be reversed. Subsequently, the connection structure CNS and the peripheral structure PER may be bonded to each other. The fourth bonding pad BP4 may be bonded to the first bonding pad BP1. Accordingly, the cell plug CPL may be electrically connected to the first peripheral transistor TR1. The fifth bonding pad BP5 may be bonded to the second bonding pad BP2. Accordingly, the conductive pattern CP may be electrically connected to the second peripheral transistor TR2. The sixth bonding pad BP6 may be bonded to the third bonding pad BP3.

Figure 7:
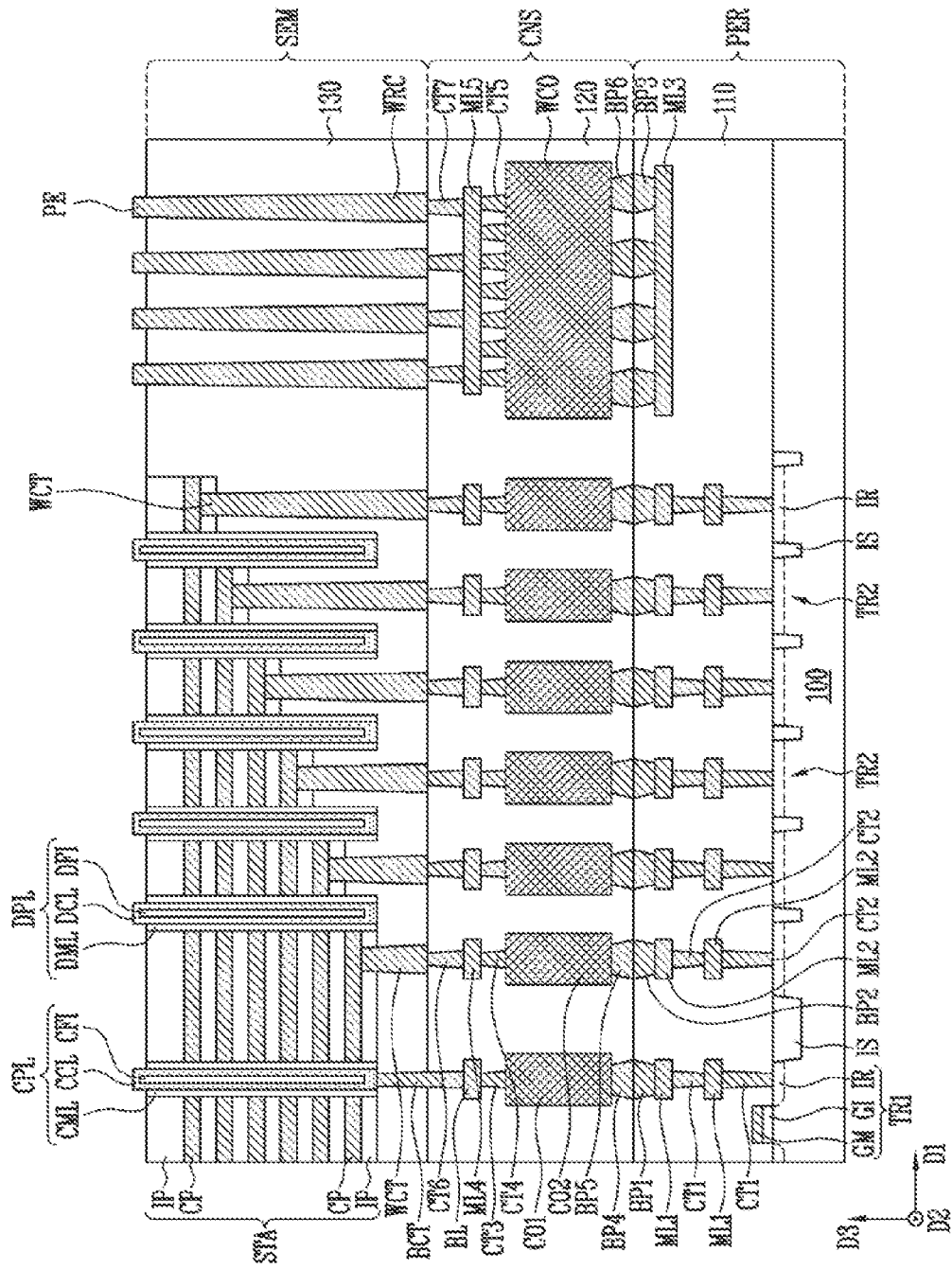

Referring to FIG. 7, the second substrate 200 may be removed. Accordingly, the preliminary etching part PE of the wire contact WRC may be exposed. The preliminary etching part PE of the wire contact WRC may protrude farther in the upward direction D3 than the third insulating layer 130 of the semiconductor structure SEM. An upper portion of the cell memory layer CML of the cell plug CPL and an upper portion of the dummy memory layer DML of the dummy plug DPL may be removed. In some embodiments, the upper portion of the cell memory layer CML of the cell plug CPL and the upper portion of the dummy memory layer DML of the dummy plug DPL may be removed together with the second substrate 200 in a process of removing the second substrate 200. In some embodiments, the upper portion of the cell memory layer CML of the cell plug CPL and the upper portion of the dummy memory layer DML of the dummy plug DPL may be removed through a process separate from the process of removing the second substrate 200.

When the upper portion of the cell memory layer CML of the cell plug CPL and the upper portion of the dummy memory layer DML of the dummy plug DPL are removed, the cell channel layer CCL of the cell plug CPL may be exposed, and the dummy channel layer DCL of the dummy plug DPL may be exposed.

Figure 8:
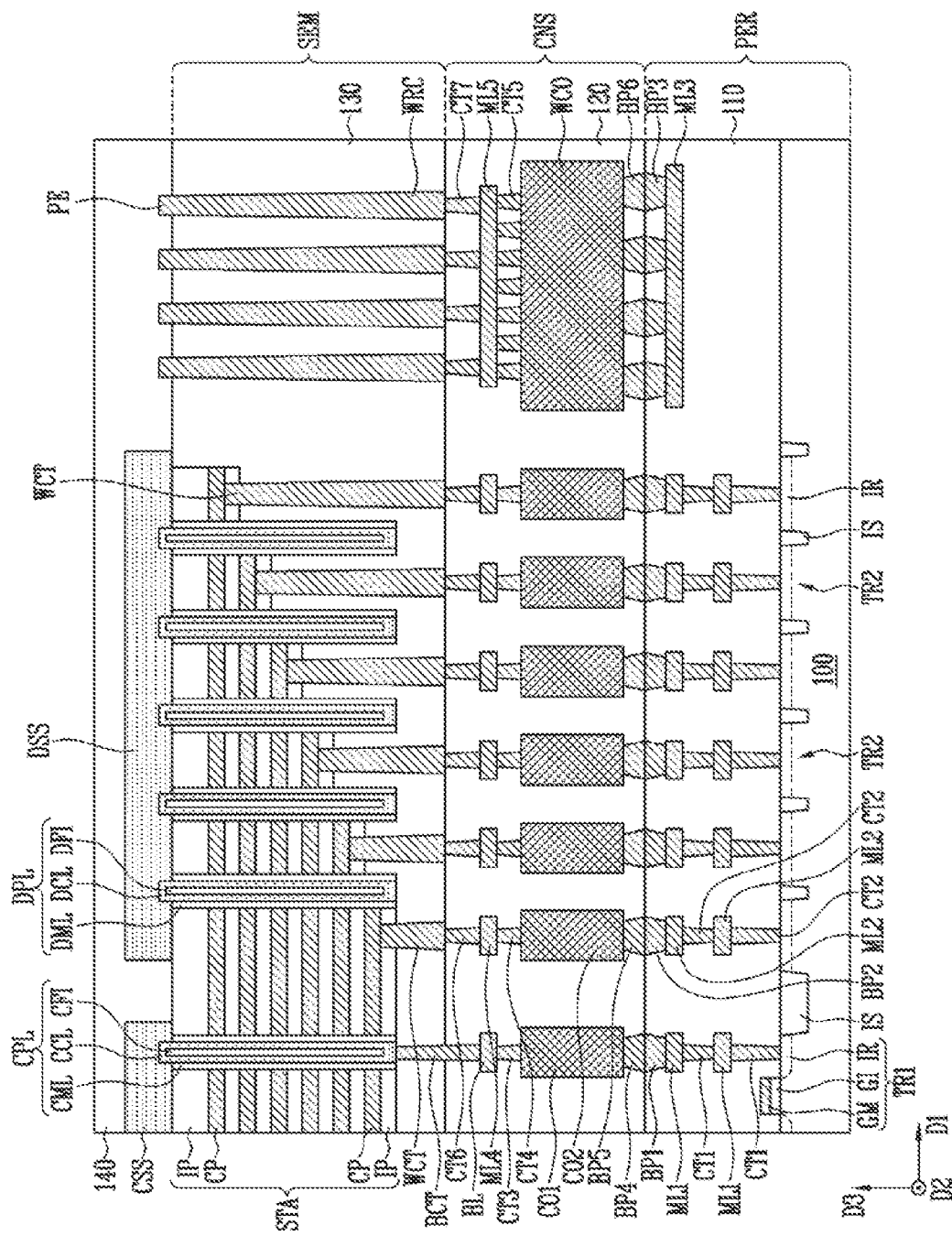

Referring to FIG. 8, a cell source structure CSS and a dummy source structure DSS may be formed. The forming of the cell source structure CSS and the dummy source structure DSS may include forming a preliminary source structure (not shown) connected to the cell plug CPL and the dummy plugs DPL, and isolating the preliminary source structure into the cell source structure CSS and the dummy source structure DSS.

A fourth insulating layer 140 may be formed to cover the cell source structure CSS and the dummy source structure DSS. The preliminary etching part PE of the wire contact WRC may be covered by the fourth insulating layer 140.

Figure 9:
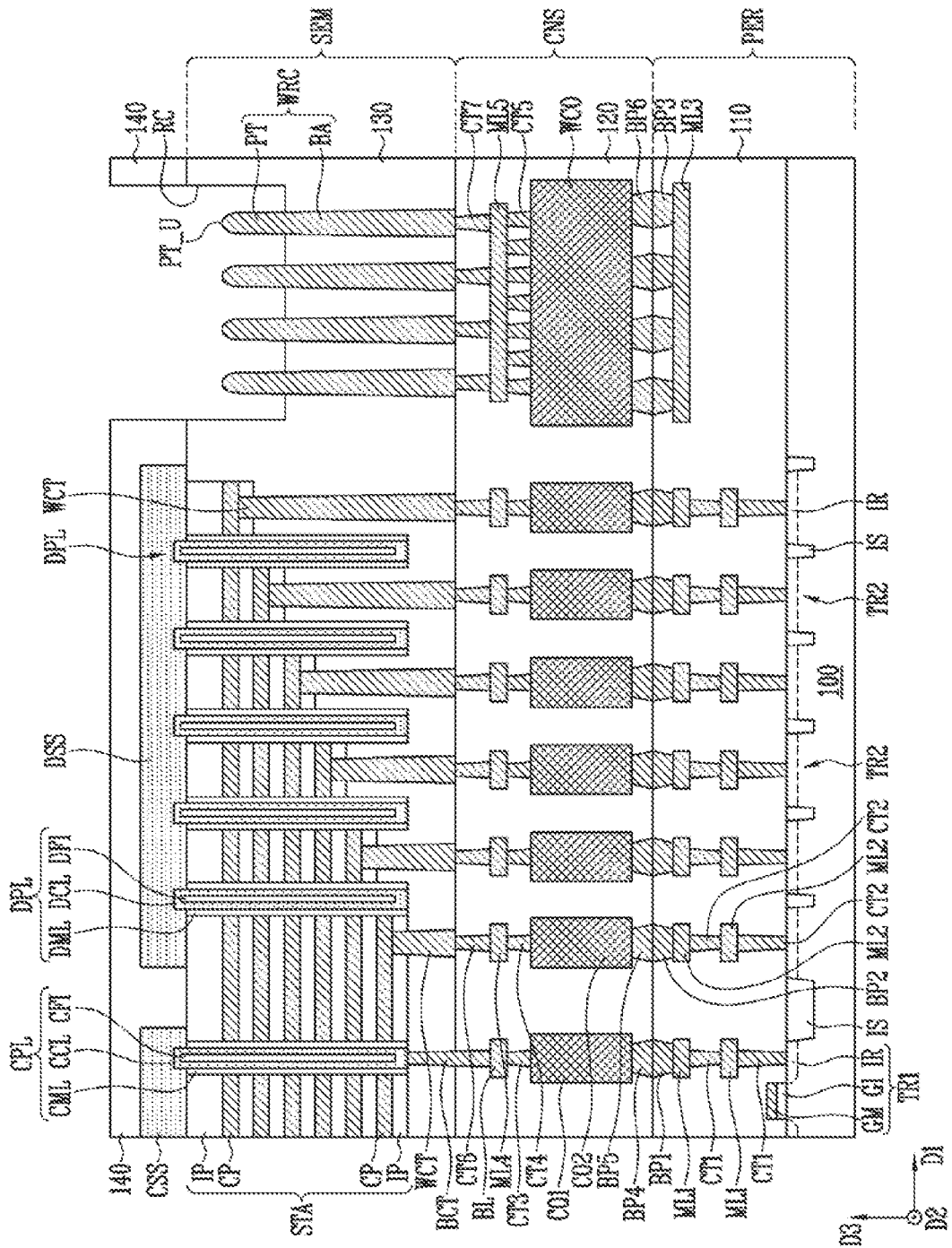

Referring to FIG. 9, a recess RC may be formed by etching the fourth insulating layer 140 and the third insulating layer 130. In the process of forming the recess RC, the wire contacts WRC may be etched together with the third and fourth insulating layers 130 and 140. The third insulating layer 130, the fourth insulating layer 140, and the wire contacts WRC may be etched by using a first etching material capable of etching the third insulating layer 130, the fourth insulating layer 140, and the wire contacts WRC. The wire contacts WRC may have an etch selectivity with respect to the third insulating layer 130 and the fourth insulating layer 140. A rate at which the third insulating layer 130 and the fourth insulating layer 140 are etched by the first etching material may be higher than a rate at which the wire contact WRC is etched by the first etching material.

The preliminary etching part PE of the wire contact WRC may be removed during etching of the wire contact WRC. A length of the wire contact WRC may be decreased by etching of the wire contact WRC. In an embodiment, a maximum length of the wire contact WRC in the third direction D3 may be decreased by etching of the wire contact WRC. A top surface PTU of a protrusion part PT of the wire contact WRC may be formed in a curved shape by etching of the wire contact WRC.

The protrusion part PT of the wire contact WRC may be exposed through the recess RC by etching of the third insulating layer 130.

Subsequently, a bonding wire BW may be formed to be connected to the exposed wire contacts WRC as shown in FIG. 1A. And a fifth insulating layer 150 may be formed to fill the recess RC as shown in FIG. 1A.

Figure 10:
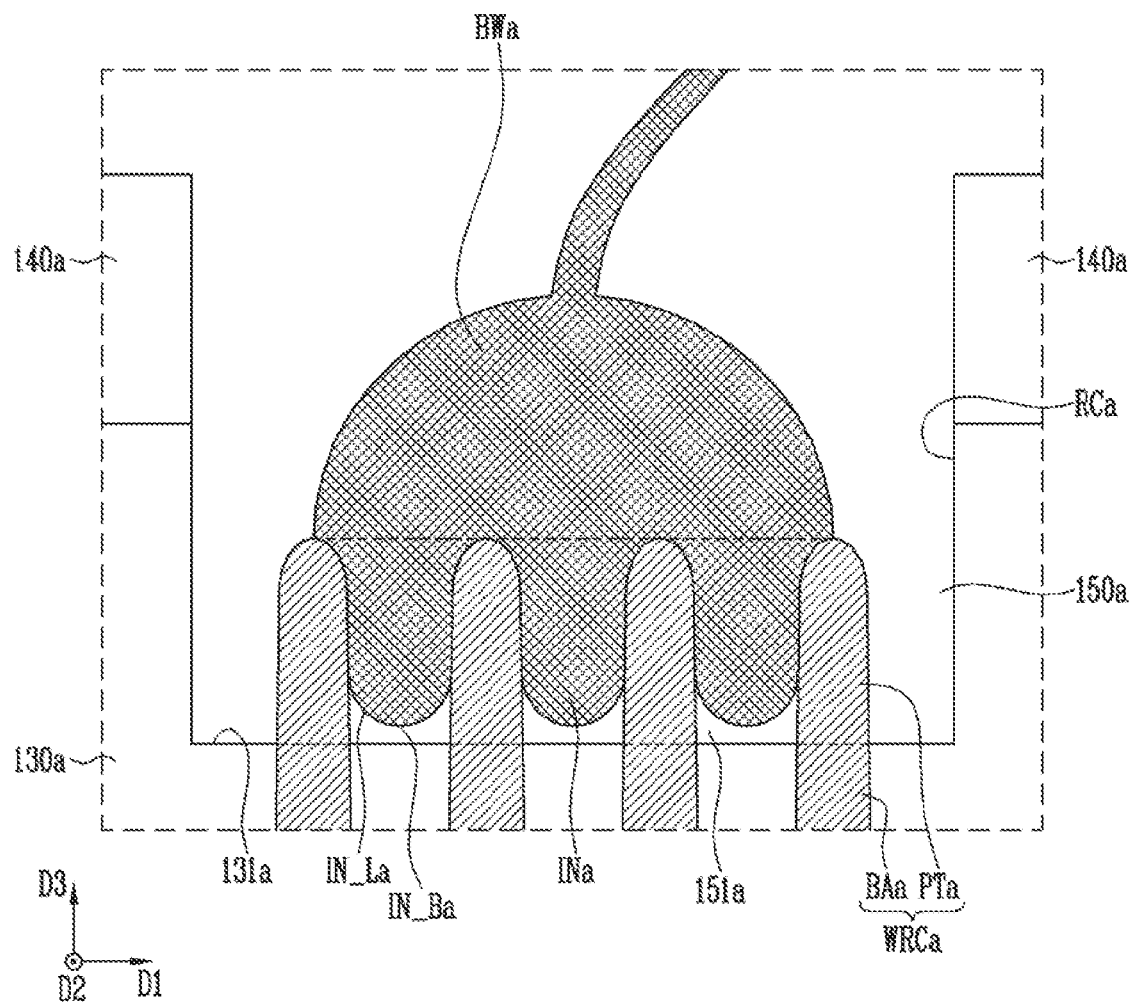
FIG. 10 is a sectional view illustrating wire contacts and a bonding wire in accordance with an embodiment of the present disclosure.

FIG. 10 is a sectional view illustrating wire contacts and a bonding wire in accordance with embodiments of the present disclosure.

A semiconductor device in accordance with these embodiments may be similar to the semiconductor device in accordance with the embodiments shown in FIGS. 1A to 1C, except portions described below.

Referring to FIG. 10, a recess RCa may be defined by a third insulating layer 130a and a fourth insulating layer 140a. A fifth insulating layer 150a may fill the recess RCa. Protrusion parts PTa of wire contacts WRCa may be exposed through the recess RCa. Base parts BAa of the wire contacts WRCa may be located in the third insulating layer 130a. Interposition parts INa of a bonding wire BWa may be interposed between the protrusion parts PTa of the wire contacts WRCa.

A first surface 131a of the third insulating layer 130a may be a surface defining a bottom surface of the recess RCa. The interposition part INa of the bonding wire BWa may be spaced apart from the third insulating layer 130a. A lower surface IN_La and a lowermost portion IN_Ba of the interposition part INa of the bonding wire BWa may be spaced apart from the first surface 131a of the third insulating layer 130a. A first portion 151a of the fifth insulating layer 150a may be interposed between the interposition part INa of the bonding wire BWa and the first surface 131a of the third insulating layer 130a. The interposition part INa of the bonding wire BWa and the first surface 131a of the third insulating layer 130a may be spaced apart from each other by the first portion 151a of the fifth insulating layer 150a. The lower surface IN_La and a lowermost portion IN_Ba of the interposition part INa of the bonding wire BWa may be in contact with the first portion 151a of the fifth insulating layer 150a.

Figure 11:
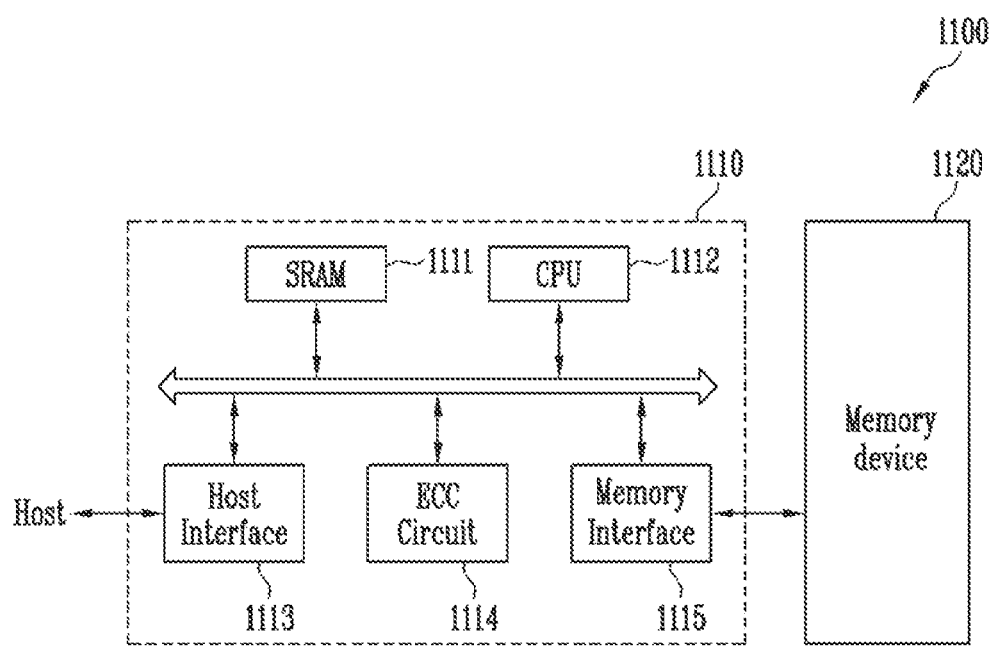
FIG. 11 is a block diagram illustrating a configuration of a memory system in accordance with an embodiment of the present disclosure.

FIG. 11 is a block diagram illustrating a configuration of a memory system 1100 in accordance with an embodiment of the present disclosure.

Referring to FIG. 11, the memory system 1100 may include a memory device 1120 and a memory controller 1110.

The memory device 1120 may include the semiconductor device described above. The memory device 1120 may be a multi-chip package configured with a plurality of flash memory chips.

The memory controller 1110 is configured to control the memory device 1120, and may include Static Random Access Memory (SRAM) 1111, a Central Processing Unit (CPU) 1112, a host interface 1113, an Error Correction Code (ECC) circuit 1114, and a memory interface 1115. The SRAM 1111 is used as operation memory of the CPU 1112, the CPU 1112 performs overall control operations for data exchange of the memory controller 1110, and the host interface 1113 includes a data exchange protocol for a host connected with the memory system 1100. The ECC circuit 1114 detects and corrects errors included in a data read from the memory device 1120, and the memory interface 1115 interfaces with the memory device 1120. In addition, the memory controller 1110 may further include ROM for storing code data for interfacing with the host, and the like.

The memory system 1100 configured as described above may be a memory card or a Solid State Drive (SSD), in which the memory device 1120 is combined with the controller 1110. For example, when the memory system 1100 is an SSD, the memory controller 1110 may communicate with the outside (e.g., the host) through one of various interface protocols, such as a Universal Serial Bus (USB) protocol, a Multi-Media Card (MMC) protocol, a PCI-Express (PCI-E) protocol, a Serial-ATA (SATA) protocol, a Parallel-ATA (PATA) protocol, a Small Computer System Interface (SCSI) protocol, an Enhanced Small Disk Interface (ESDI) protocol, and an Integrated Drive Electronics (IDE) protocol.

Figure 12:
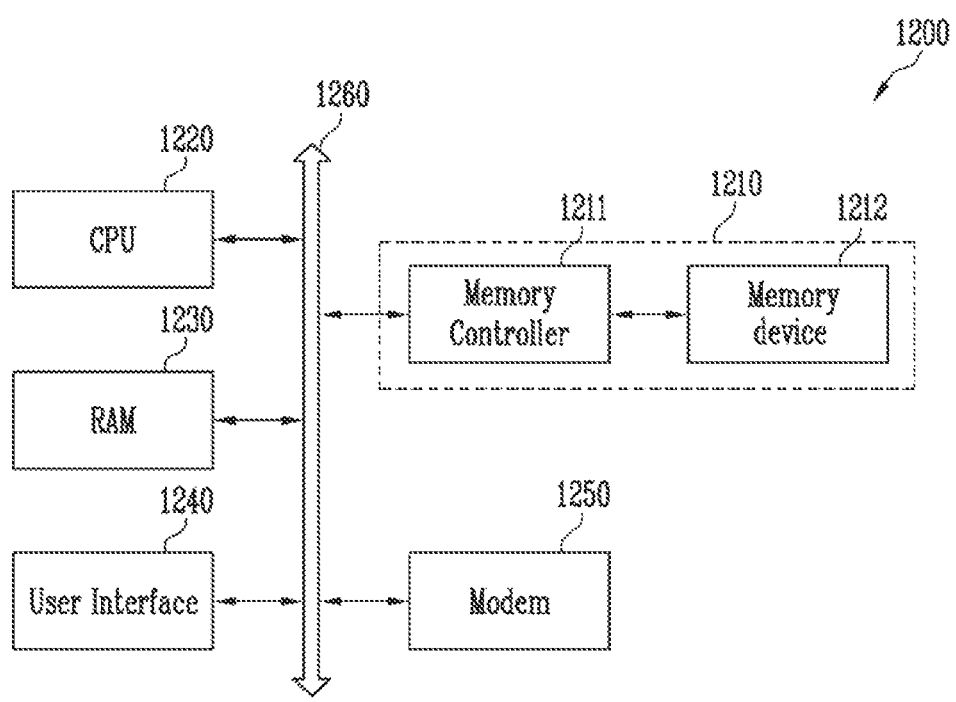
FIG. 12 is a block diagram illustrating a configuration of a computing system in accordance with an embodiment of the present disclosure.

FIG. 12 is a block diagram illustrating a configuration of a computing system 1200 in accordance with an embodiment of the present disclosure.

Referring to FIG. 12, the computing system 1200 may include a CPU 1220, random access memory (RAM) 1230, a user interface 1240, a modem 1250, and a memory system 1210, which are electrically connected to a system bus 1260. When the computing system 1200 is a mobile device, a battery for supplying an operation voltage to the computing system 1200 may be further included, and an application chip set, a camera image processor, mobile DRAM, and the like may be further included.

The memory system 1210 may be configured with a memory device 1212 and a memory controller 1211, which are similar to those described with reference to FIG. 11.

In a semiconductor device in accordance with the present disclosure, a bonding wire, wire contacts, and a wire connection conductor may be disposed adjacent to a stack structure and a cell plug. Thus the size of the semiconductor device may be reduced, and the degree of integration of the semiconductor device may be improved.

In a semiconductor device in accordance with the present disclosure, wire contacts exposed through a recess may be connected to a bonding wire, and it is possible to prevent the bonding wire from contacting conductors other than the wire contacts. Accordingly, the operational reliability of the semiconductor device may be improved.

What is claimed is:

1. A semiconductor device comprising:
   a first insulating layer;
   wire contacts spaced apart from each other by the first insulating layer; and
   a bonding wire connected to the wire contacts,
   wherein each of the wire contacts includes a base part in the first insulating layer and a protrusion part protruding from inside to outside the first insulating layer, and
   wherein the protrusion parts of the wire contacts are in direct contact with the bonding wire.

2. The semiconductor device of claim 1, wherein a top surface of the first insulating layer is depressed to define a recess, and
   wherein the protrusion parts of the wire contacts are exposed through the recess.

3. The semiconductor device of claim 2, further comprising a second insulating layer filling the recess.

4. The semiconductor device of claim 2, wherein the bonding wire is disposed in the recess.

5. The semiconductor device of claim 1, wherein the bonding wire includes at least one interposition part interposed between the protrusion parts of the wire contacts.

6. The semiconductor device of claim 5, wherein the at least one interposition part is in contact with the first insulating layer.

7. The semiconductor device of claim 5, wherein the at least one interposition part is in contact with sidewalls of the protrusion parts of the wire contacts.

8. A semiconductor device comprising:
a first insulating layer including a recess;
wire contacts exposed by the recess of the first insulating layer;
a bonding wire connected to the wire contacts; and
a second insulating layer filling the recess,
wherein the bonding wire includes at least one interposition part interposed between the wire contacts, and
wherein a lower surface of the at least one interposition part is in contact with at least one of the first insulating layer and the second insulating layer.

9. The semiconductor device of claim 8, wherein a lowermost portion of the at least one interposition part is in contact with the first insulating layer.

10. The semiconductor device of claim 8, wherein each of the wire contacts includes a base part in the first insulating layer and a protrusion part exposed by the recess.

11. The semiconductor device of claim 10, wherein the at least one interposition part is interposed between the protrusion parts of the wire contacts.

12. The semiconductor device of claim 8, further comprising a stack structure including alternately stacked conductive patterns and insulating patterns,
wherein the first insulating layer surrounds the stack structure.

13. The semiconductor device of claim 12, wherein the wire contacts are disposed at a same level as the stack structure.

14. A semiconductor device comprising:
a semiconductor structure including a stack structure and an insulating layer surrounding the stack structure;
a peripheral circuit structure including a peripheral transistor;
a connection structure disposed between the semiconductor structure and the peripheral circuit structure, the connection structure including a wire connection conductor;
wire contacts penetrating the insulating layer, the wire contacts being electrically connected to the wire connection conductor; and
a bonding wire directly connected to the wire contacts.

15. The semiconductor device of claim 14, wherein the wire connection conductor and the wire contacts include different materials.

16. The semiconductor device of claim 15, wherein the wire connection conductor includes at least one of copper and aluminum.

17. The semiconductor device of claim 14, wherein the semiconductor structure further includes a cell plug penetrating the stack structure,
wherein the connection structure includes a first connection conductor electrically connecting the peripheral transistor and the cell plug, and
wherein the first connection conductor is disposed at a same level as the wire connection conductor.

18. The semiconductor device of claim 17, wherein the first connection conductor and the wire connection conductor include the same material.

19. The semiconductor device of claim 14, wherein the stack structure includes a conductive pattern electrically connected to the peripheral transistor,
wherein the connection structure includes a second connection conductor electrically connecting the peripheral transistor and the conductive pattern, and
wherein the second connection conductor is disposed at a same level as the wire connection conductor.

20. A method of manufacturing a semiconductor device, the method comprising:
forming a stack structure including alternately stacked conductive patterns and insulating patterns;
forming an insulating layer surrounding the stack structure;
forming wire contacts penetrating the insulating layer;
etching the insulating layer to expose the wire contacts; and
forming a bonding wire directly connected to the wire contacts.

21. The method of claim 20, wherein etching the insulating layer includes etching the wire contacts together with the insulating layer.

22. The method of claim 21, wherein etching the wire contacts includes decreasing a length of each of the wire contacts.

23. The method of claim 20, wherein forming wire contacts penetrating the insulating layer comprises forming the wire contacts to be spaced apart from each other by the insulating layer.

24. The method of claim 20, further comprising:
forming a cell plug penetrating the stack structure, wherein the cell plug is formed to include a cell channel layer and a cell memory layer surrounding the cell channel layer and
removing an upper portion of the cell memory layer of the cell plug to expose the cell channel layer.

25. The method of claim 20, further comprising:
forming a first bonding pad electrically connected to each of the conductive patterns;
forming a peripheral transistor;
forming a second bonding pad electrically connected to the peripheral transistor; and
bonding the first bonding pad and the second bonding pad to each other.

26. The method of claim 20, wherein etching the insulating layer to expose the wire contacts includes etching a top surface of each of the wire contacts to have a curved shape.

* * * * *